US011866847B2

(12) United States Patent
Liu et al.

(10) Patent No.: US 11,866,847 B2
(45) Date of Patent: Jan. 9, 2024

(54) SYSTEMS AND METHODS FOR DISASSEMBLING TWO-DIMENSIONAL VAN DER WAALS CRYSTALS INTO MACROSCOPIC MONOLAYERS AND REASSEMBLING INTO ARTIFICIAL LATTICES

(71) Applicant: THE TRUSTEES OF COLUMBIA UNIVERSITY IN THE CITY OF NEW YORK, New York, NY (US)

(72) Inventors: Fang Liu, New York, NY (US); Xiaoyang Zhu, New York, NY (US); James Hone, New York, NY (US); Sang Hoon Chae, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 290 days.

(21) Appl. No.: 17/105,105

(22) Filed: Nov. 25, 2020

(65) Prior Publication Data

US 2021/0172087 A1    Jun. 10, 2021

Related U.S. Application Data

(60) Provisional application No. 62/963,839, filed on Jan. 21, 2020, provisional application No. 62/944,753, filed on Dec. 6, 2019.

(51) Int. Cl.
*C30B 33/00* (2006.01)
*B32B 7/02* (2019.01)
(Continued)

(52) U.S. Cl.
CPC ............ *C30B 33/00* (2013.01); *B32B 7/02* (2013.01); *B32B 18/00* (2013.01); *B32B 37/025* (2013.01);
(Continued)

(58) Field of Classification Search
CPC ......... C30B 33/00; C30B 29/64; C30B 33/06; B32B 7/02; B32B 18/00; B32B 37/025;
(Continued)

(56) References Cited

U.S. PATENT DOCUMENTS 9,666,674 B2    5/2017   Dimitrakopoulos et al.
9,809,903 B2    11/2017  Das et al.
(Continued)

OTHER PUBLICATIONS

Bhuyan et al., "Synthesis of graphene," Int Nano Lett. 6:65-83 (2016).
(Continued)

*Primary Examiner* — George R Koch
*Assistant Examiner* — Christopher C Caillouet
(74) *Attorney, Agent, or Firm* — Baker Botts L.L.P.

(57) ABSTRACT

Systems and methods for generating one or more single crystal monolayers from two-dimensional van der Waals crystals are disclosed herein. Example methods include providing a bulk material including a plurality of van der Waals crystal layers, and exfoliating one or more single crystal monolayers of van der Waals crystal from the bulk material by applying a flexible and flat metal tape to a surface of the bulk material. In certain embodiments, the one or more single crystal monolayers can be assembled into an artificial lattice. The present disclosure also provides techniques for manufacturing flexible and flat metal tape for generating one or more single crystal monolayers from two-dimensional van der Waals crystals. The present disclosure also provides compositions for creating a macroscopic artificial lattice. In certain embodiments, the composition can include two or more macroscopic single crystal monolayers adapted from a bulk van der Waals crystal, where the single crystal monolayers are configured for assembly into an artificial lattice based on one or more properties.

7 Claims, 16 Drawing Sheets

(51) Int. Cl.
  B32B 37/18    (2006.01)
  C30B 29/68    (2006.01)
  B32B 37/00    (2006.01)
  B32B 18/00    (2006.01)
  C30B 29/46    (2006.01)
  C23C 14/30    (2006.01)
  C23C 14/16    (2006.01)
  B32B 43/00    (2006.01)
  C01G 41/00    (2006.01)
  C01G 39/06    (2006.01)

(52) U.S. Cl.
  CPC ............ *B32B 37/18* (2013.01); *B32B 43/006* (2013.01); *C23C 14/16* (2013.01); *C23C 14/30* (2013.01); *C30B 29/46* (2013.01); *C30B 29/68* (2013.01); *B32B 2315/02* (2013.01); *C01G 39/06* (2013.01); *C01G 41/00* (2013.01); *C01P 2004/24* (2013.01)

(58) Field of Classification Search
  CPC ......... B32B 37/18; C23C 14/16; C23C 14/30; C01P 2004/24
  See application file for complete search history.

(56) References Cited

U.S. PATENT DOCUMENTS

| | | | |
|---|---|---|---|
| 2017/0294629 A1* | 10/2017 | Kim | H10K 85/211 |
| 2018/0144849 A1 | 5/2018 | Jonker | |
| 2018/0186653 A1 | 7/2018 | Daniels et al. | |
| 2019/0131129 A1 | 5/2019 | Stinaff et al. | |

OTHER PUBLICATIONS

Coleman et al., "Two-dimensional nanosheets produced by liquid exfoliation of layered materials," Science 331:568-571 (2011).

Desai et al., "Gold-Mediated Exfoliation of Ultralarge Optoelectronically-Perfect Monolayers," Advanced Materials 28:4053-4058 (2016).

James Hone, NSF Grant #: 1420634, MRSEC: Columbia Center for Precision Assembly of Superstratic and Superatomic Solids, 2014.

Magda et al., "Exfoliation of large-area transition metal chalcogenide single layers," Scientific Reports 5:14714 (2015) 5 pages.

Mueller et al., "Exciton physics and device application of two-dimensional transition metal dichalcogenide semiconductors," NPJ 2D Mater Appl. Sep; 2:29 (2018).

Niu et al., "Exfoliation of self-assembled 2D organic-inorganic perovskite semiconductors," Applied Physics Letters 104:171111 (2014) 5 pages.

Randviir et al., "A decade of graphene research: production, applications and outlook," Materials Today 17(9):426-432 (2014).

Shen et al., "Surface Tension Components Based Selection of Cosolvents for Efficient Liquid Phase Exfoliation of 2D Materials," Small 12(20):2741-2749 (2016).

Singh et al., "Soft exfoliation of 2D SnO with size-dependent optical properties," 2D Materials 4:025110 (2017).

Thompson et al., "Exfoliation and analysis of large-area, air-sensitive two-dimensional materials," Journal of Visualized Experiments, e58693, doi:10.3791/58693 (2018).

Velický et al., "Mechanism of Gold-Assisted Exfoliation of Centimeter-Sized Transition-Metal Dichalcogenide Monolayers," ACS Nano 12:10463-10472 (2018).

Xiaoyang Zhu, NSF Grant #: 1809680, NSF/DMR-BSF: Auger Recombination in Two-Dimensional Quantum Confined Semiconductors, 2018.

Yang et al., "Self-surface charge exfoliation and electrostatically coordinated 2D hetero-layered hybrids," Nature Communications 8:14224 (2017) 9 pages.

Yu et al., "Multiflake Thin Film Electronic Devices of Solution Processed 2D MoS2 Enabled by Sonopolymer Assisted Exfoliation and Surface Modification," Chemistry of Materials 26:5892-5899 (2014).

* cited by examiner

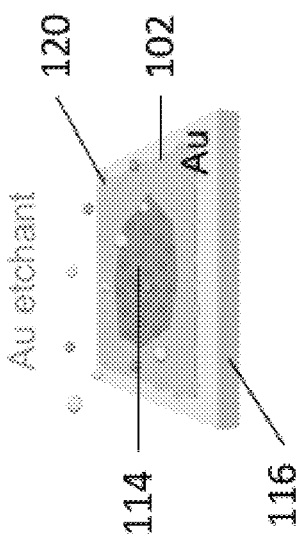

US 11,866,847 B2

SYSTEMS AND METHODS FOR DISASSEMBLING TWO-DIMENSIONAL VAN DER WAALS CRYSTALS INTO MACROSCOPIC MONOLAYERS AND REASSEMBLING INTO ARTIFICIAL LATTICES

CROSS REFERENCE TO RELATED APPLICATION

This application claims priority to U.S. Provisional Application Ser. No. 62/963,839, filed Jan. 21, 2020 and U.S. Provisional Application Ser. No. 62/944,753, filed Dec. 6, 2019, each of which is incorporated by reference herein.

STATEMENT REGARDING FEDERALLY SPONSORED RESEARCH

This invention was made with government support under grant numbers DMR-1420634 and DMR-1809680 awarded by the National Science Foundation, and grant number DE-SC00014664 awarded by the Department of Energy. The government has certain rights in the invention.

BACKGROUND

Certain techniques for disassembling two-dimensional van der Waals crystals into macroscopic monolayers can be limited based on material quality, scalability, and size. For example, liquid phase exfoliation can be scalable but generate small sizes and poor quality. Chemical vapor deposition can be scalable but yield a high defect density. Mechanical exfoliation can produce high quality monolayers but at a low yield.

Accordingly, there exists a need for a high throughput technique for disassembling two-dimensional van der Waals crystals into high quality macroscopic monolayers.

SUMMARY

Systems and methods for generating one or more single crystal monolayers from two-dimensional van der Waals crystals are disclosed herein.

Example methods include providing a bulk material including a plurality of van der Waals crystal layers, and exfoliating one or more single crystal monolayers of van der Waals crystal from the bulk material by applying a flexible and flat metal tape to a surface of the bulk material. The flexible and flat metal tape can have a surface root-mean-square roughness of less than about 2 nm. In certain embodiments, the flexible and flat metal tape can have a surface root-mean-square roughness of less than about 1 nm.

In certain embodiments of the present disclosure, the metal can be an air-stable metal, including coinage metals. For example, the metal can be Gold, Silver, Platinum, Palladium, Coper, Nickel, and/or Chromium.

In certain embodiments, the one or more single crystal monolayers can be assembled into an artificial lattice.

In certain embodiments, the exfoliating can include pressing the flexible and flat metal tape on to a surface of the bulk material and removing the flexible and flat metal tape off the surface to form a single crystal monolayer on the metal surface. In certain embodiments, the flexible and flat metal tape can include a thermal release tape having a layer including a soluble protection layer and a metal layer, where the removing further includes heating the tape, dissolving the protection layer in water, and dissolving the metal layer in an etchant solution.

The present disclosure also provides techniques for manufacturing flexible and flat metal tape for generating one or more single crystal monolayers from two-dimensional van der Waals crystals. An example method includes forming a layer of metal on an ultra-flat wafer, depositing a soluble polymer on the metal layer, and removing the metal layer and the polymer layer from the ultra-flat wafer.

In certain embodiments, the forming can include a metal layer having a surface root-mean-square roughness of less than about 2 nm. In certain embodiments, the forming can include a metal layer having a surface root-mean-square roughness of less than about 1 nm. In certain embodiments, the forming can include a metal layer having a surface root-mean-square roughness in the range of about 0.3 to about 0.5 nm. For example, the metal can be Gold, Silver, Platinum, Palladium, Coper, Nickel, and/or Chromium.

The ultra-flat wafer can be selected from a silicon wafer, a germanium wafer, a mica wafer, a single crystal semiconductor wafer, and a super-polished surface such as fused silica or glass.

In certain embodiments, the depositing includes coating the metal layer with the polymer. For example, the coating can be spin-coating.

In certain embodiments, the protection layer includes a soluble polymer. For example, the protection layer can be a water-soluble polyvinylpyrrolidone or an organic solvent-soluble polypropylene carbonate or polycarbonate or polycaprolactone polymer.

The present disclosure also provides compositions for creating a macroscopic artificial lattice. In certain embodiments, the composition can include two or more macroscopic single crystal monolayers adapted from bulk van der Waals crystals, where the single crystal monolayers are configured for assembly into an artificial lattice based on one or more properties. In certain embodiments, the one or more properties can include nonlinear optical properties.

In certain embodiments of the present disclosure, a first of the two or more macroscopic single crystal monolayers can have an orientation difference from a second of the two or more macroscopic single crystal monolayers, where the first and single crystal monolayers are adapted for reassembly into an artificial lattice. In certain embodiments, the orientation difference can be about 180 degrees. In certain embodiments, a first of the two or more macroscopic single crystal monolayers and a second of the two or more macroscopic single crystal monolayers are configured to create one of a single crystal heterobilayer or a single crystal heteromultilayer.

The accompanying drawings, which are incorporated and constitute part of this disclosure, illustrate embodiments of the present disclosure.

BRIEF DESCRIPTION OF THE DRAWINGS

FIGS. 1A-1J illustrate an example layer-by-layer exfoliation procedure of a bulk van der Waals crystal in accordance with certain embodiments of the present disclosure;

Figure 1A:
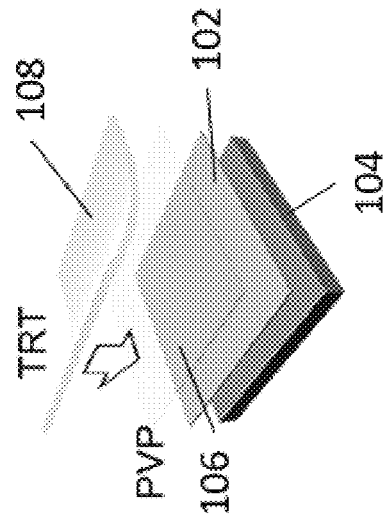

Throughout the drawings, the same reference numerals and characters, unless otherwise stated, are used to denote like features, elements, components or portions of the illustrated embodiments. Moreover, while the present disclosure will now be described in detail with reference to the Figs., it is done so in connection with the illustrative embodiments.

DETAILED DESCRIPTION

Techniques for disassembling two-dimensional van der Waals (vdW) crystals into macroscopic monolayers and reassembling into artificial lattices are disclosed herein.

The disclosed techniques can achieve high throughput disassembly of 2D vdW crystals layer-by-layer into single crystal monolayers, with near unity yield. The techniques disclosed herein can work for a range of vdW materials and generate monolayers with macroscopic dimensions comparable to the sizes of the bulk crystals, shown here for mm to cm lateral dimensions.

Figure 1B:
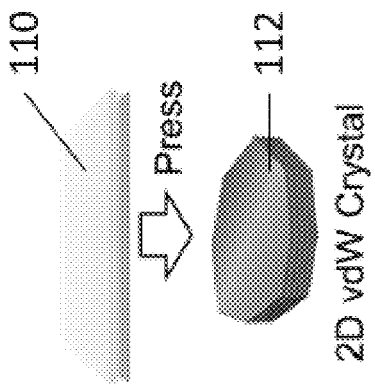
Figure 1C:
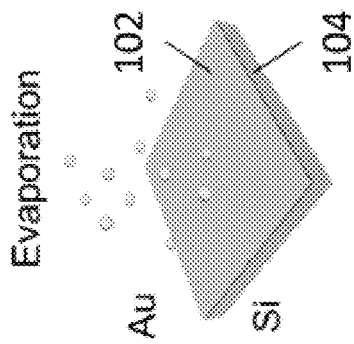

As schematically shown in FIGS. 1A-1J, a bulk vdW crystal can be exfoliated layer-by-layer. A flexible and flat metal tape can be achieved with a template stripping technique as shown in FIGS. 1A-1C. For example, the flexible and flat metal tape can include a thermal release tape ("TRT") 108 having a layer including a soluble protection layer 106 and a metal layer 104. The metal tape can be suitably flat when a surface root-mean-square roughness of a side of the metal layer 106 opposite the soluble protection layer 104 is less than about 2 nm. In certain embodiments, the surface root-mean-square roughness of the side of the metal layer 106 opposite the soluble protection layer 104 can be less than about 1 nm. In certain embodiments, the surface root-mean-square roughness of the side of the metal layer 106 opposite the soluble protection layer 104 can be in the range of about 0.3 to about 0.5 nm. The metal tape can be suitably flexible, for example, when the tensile strength is about 30 kg/mm$^2$, and Young's modulus is about 5000 kg/mm$^2$.

As shown in FIG. 1A, the metal layer 102 can be deposited on an ultra-flat wafer 104. The ultra-flat wafer can be, for example, between 500 μm and 1 mm thick. The metal layer 102 can be an air-stable metal, including coinage metals. For example, the metal layer 102 can be Gold, Silver, Platinum, Palladium, Coper, Nickel, and/or Chromium. When implemented in inert environments, such as a glovebox or vacuum, the metal layer 102 can be Tin or Zinc.

The ultra-flat wafer 104 can be a silicon wafer, a germanium wafer, a mica wafer, a single crystal semiconductor wafer, and a super-polished surface such as fused silica or glass. As shown in FIG. 1B, the soluble protection layer 106 can be coated to the surface of the metal layer 102. The soluble protection layer 106 can be a polymer, such as water-soluble polyvinylpyrrolidone or organic solvent-soluble polypropylene carbonate or polycarbonate or polycaprolactone polymer.

As shown in FIG. 1C, the thermal release tape 108 can strip the soluble protection layer 106 and the metal layer 102 off the ultra-flat silicon wafer 104 to obtain the flexible and flat metal tape 110. The exposed metal surface 102 is templated by the flat substrate with roughness on the A scale. The flexible and flat metal tape allows intimate and uniform vdW contact between the metal and the 2D vdW crystal surface, exfoliating a complete monolayer, which can be transferred onto the desired substrate. For example, intimate and uniform vdW contact occurs when the interfacial roughness between the metal and the 2D vdW crystal surface is less than about 2 nm. In certain embodiments, the interfacial roughness between the metal and the 2D vdW crystal surface can be less than about 1 nm. In certain embodiments, the interfacial roughness between the metal and the 2D vdW crystal surface can be in the range of about 0.3 to about 0.5 nm.

Figure 1D:
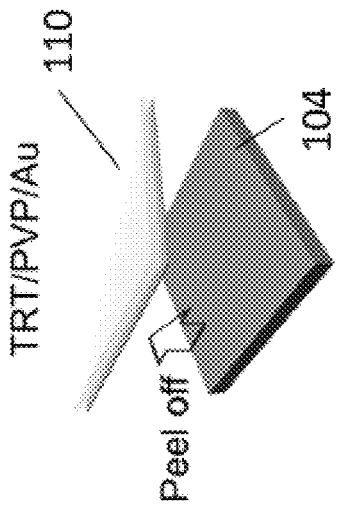
Figure 1E:
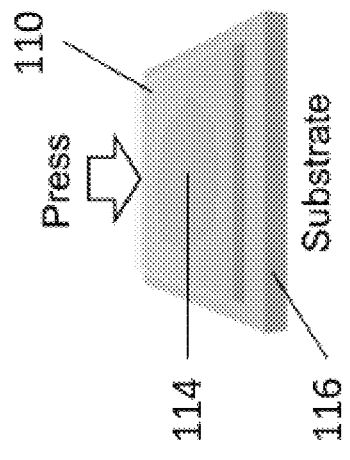
Figure 1F:
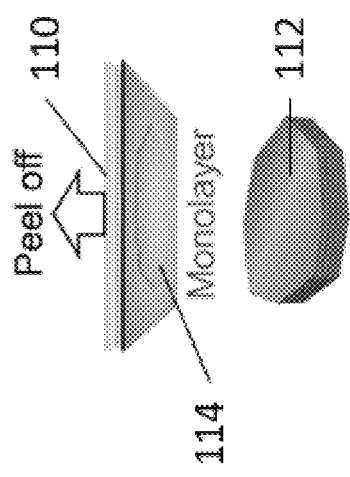
Figure 1G:
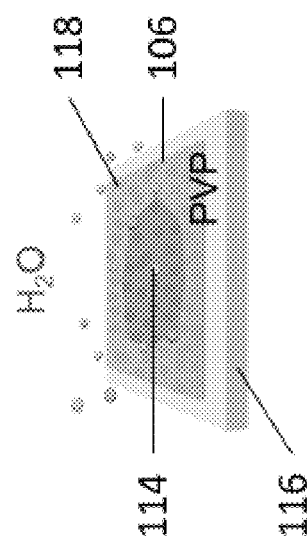
Figure 1H:
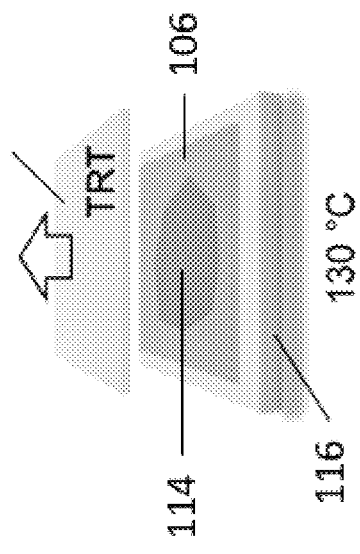

FIG. 1D illustrates the flexible and flat metal tape 110 being pressed on to the surface of a bulk vdW crystal 112. The flexible and flat metal tape 110 can peel a monolayer 114 off the bulk vdW crystal 112 as in FIG. 1E, and the monolayer 114 can be transferred onto a substrate 116 as in FIG. 1F. As shown in FIG. 1G, the thermal release tape 108 can be removed with heat. For example, thermal release tape 108 can be removed at between about 100° C. and 140° C. The soluble protection layer 106 can be dissolved in water 118 or an organic solvent as in FIG. 1H, and the metal layer 102 can be dissolved in an etchant solution 120 as in FIG. 1I. As shown in FIG. 1J, the single crystal monolayer 114 with macroscopic dimensions can be obtained. For example, after removing the thermal release tape, washing off the PVP layer, and etching of gold with a mild etchant solution (I$_2$/I$^-$), a monolayer with macroscopic dimension (typically mm to cm) can be obtained.

Figure 2B:
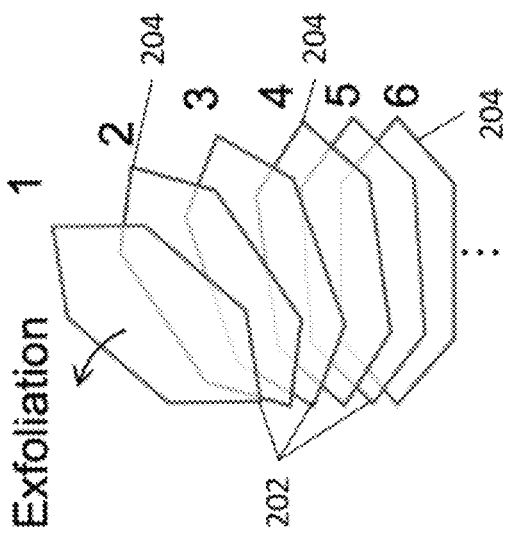
FIGS. 2A-2C illustrate disassembly of a van der Waals crystal into single crystal monolayers in accordance with certain embodiments of the present disclosure.
Figure 2A:
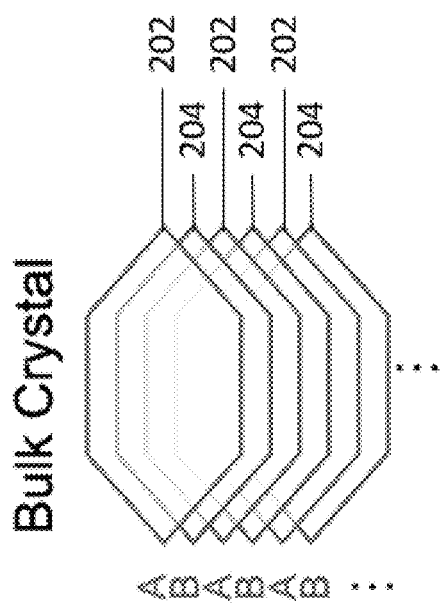
Figure 2C:
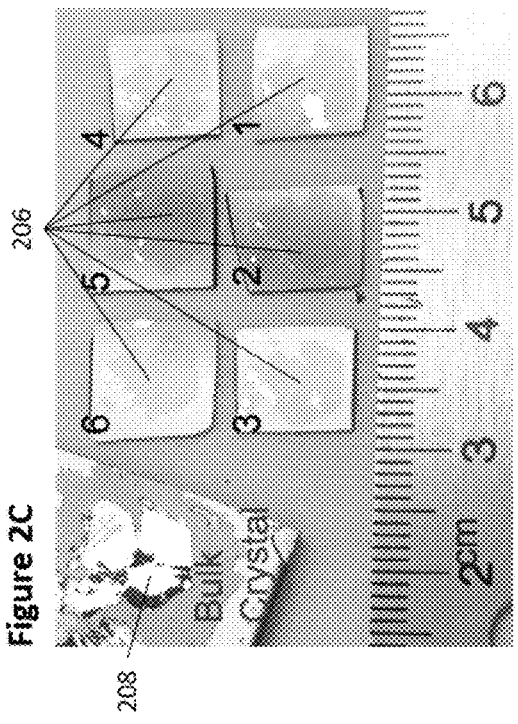
Figure 3C:
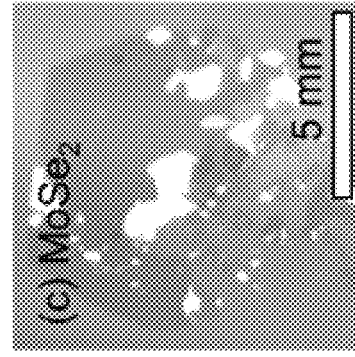
FIGS. 3A-3F are optical images of single crystal monolayers and heterobilayers exfoliated from the metal tape methods in accordance with certain embodiments of the present disclosure.
Figure 3F:
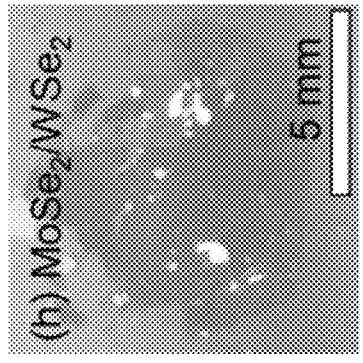
Figure 3B:
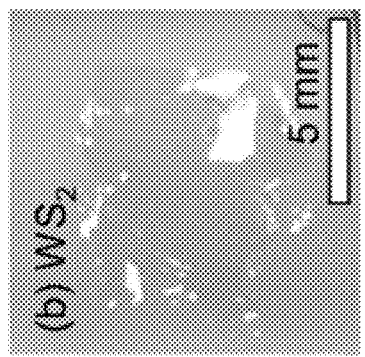
Figure 3E:
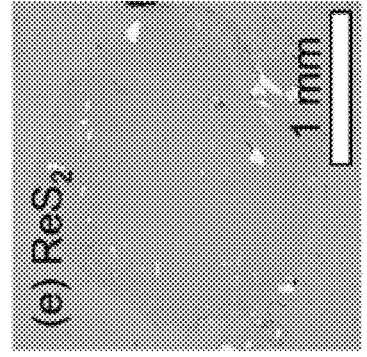
Figure 3A:
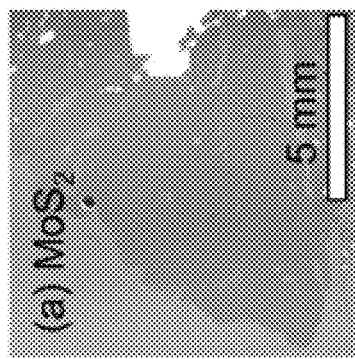
Figure 3D:
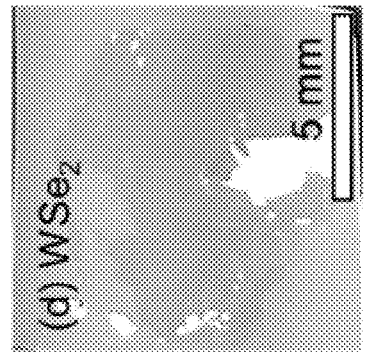

As illustrated in FIGS. 2A-2B, the layer-by-layer exfoliation technique can yield even layers 202 and odd layers 204 with a difference in crystallographic orientations. As illustrated for WSe$_2$ in FIG. 2C, the strong adhesion of gold to TMDCs can repeatedly generate complete single crystal monolayers 206, each adopting the shape of the entire surface of a bulk crystal 208. The yield of exfoliation, expressed as the percentage of monolayer area picked up from the contacted bulk crystal surface, can be close to unity.

This technique can be applied to a broad range of vdW crystals, as demonstrated for single crystal TMDCs monolayers (e.g., $WS_2$, $MoS_2$, $WSe_2$, $MoSe_2$, and $ReS_2$) on various substrates, such as $SiO_2/Si$, fused silica, and sapphire.

Optical images of the monolayers are shown in FIGS. 3A-3F. Each TMDC sample is dominated by the single crystal monolayer, sometimes with small regions of multilayers near the edges, resulting from the contact of the gold tape to imperfect or non-flat regions on the edges of TMDC bulk crystal.

Figure 4:
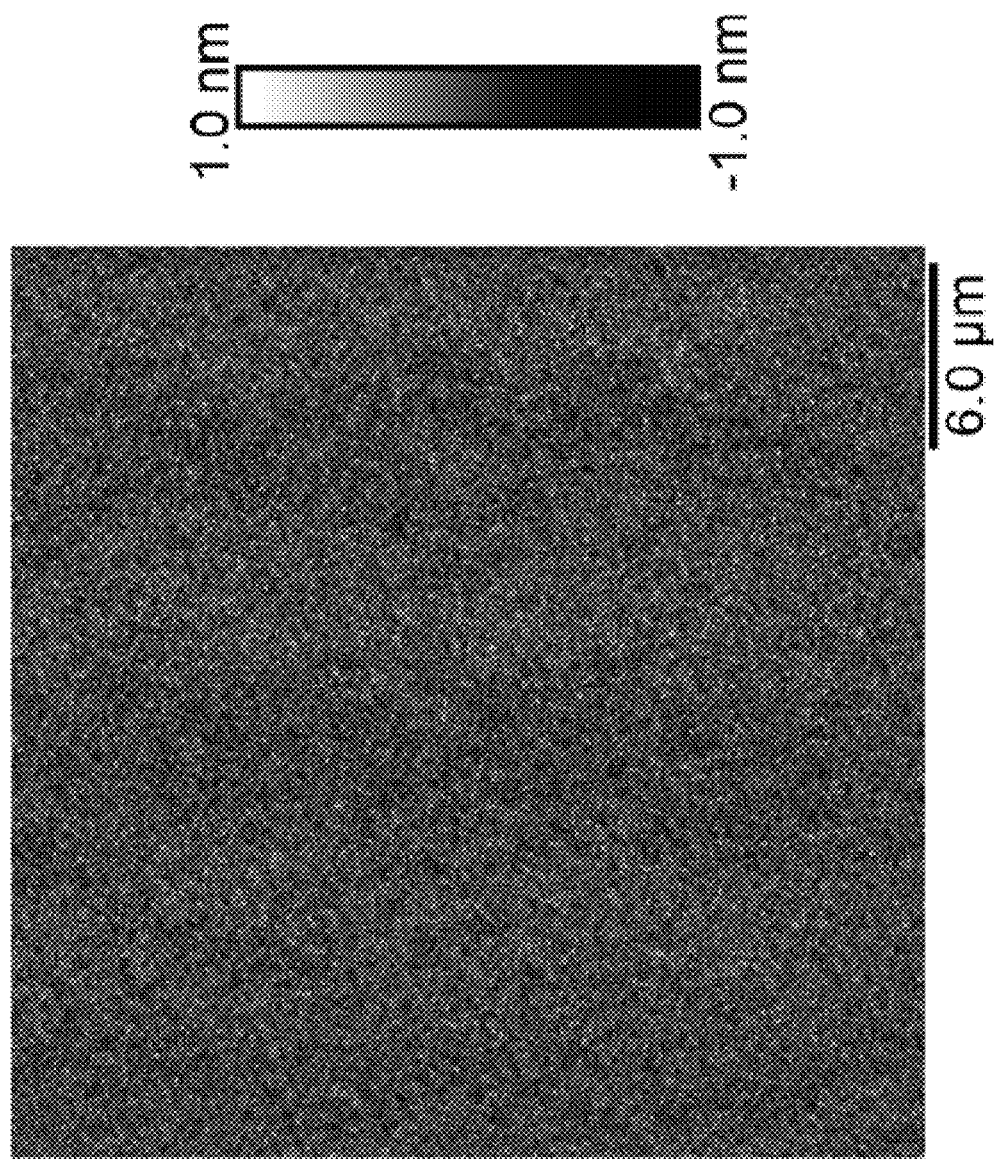
FIG. 4 is an atomic force microscopy image of a MoS$_2$ monolayer on a SiO$_2$/Si substrate in accordance with certain embodiments of the present disclosure.
Figure 5A:
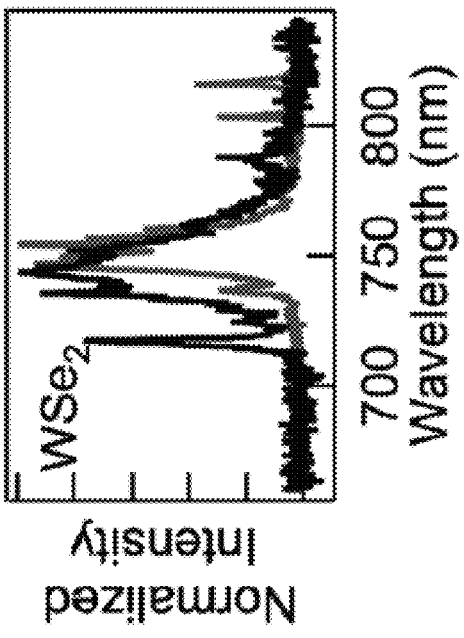
FIGS. 5A-5G illustrate a comparison of photoluminescence spectra and intensity distributions of single crystal monolayers in accordance with certain embodiments of the present disclosure.
Figure 5B:
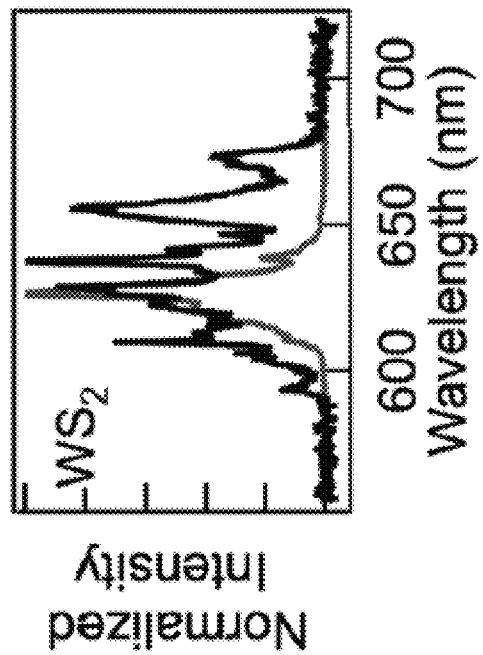
Figure 5C:
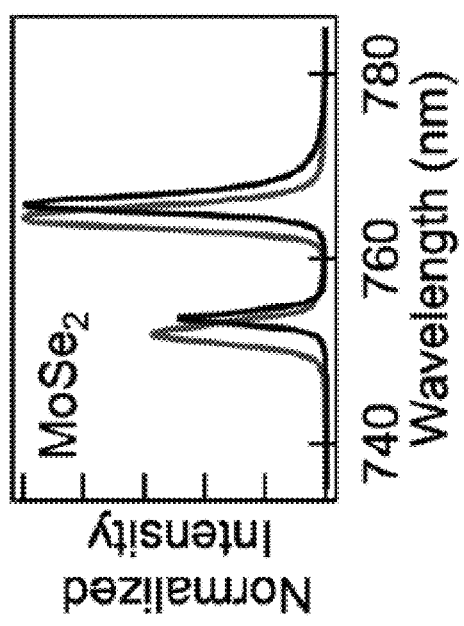
Figure 5D:
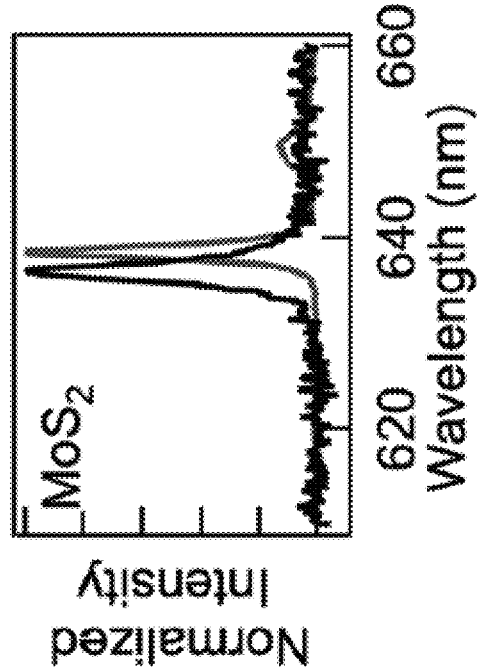
Figure 5F:
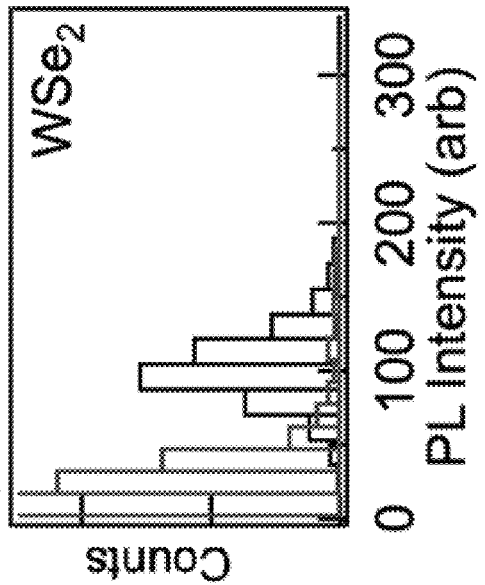
Figure 5G:
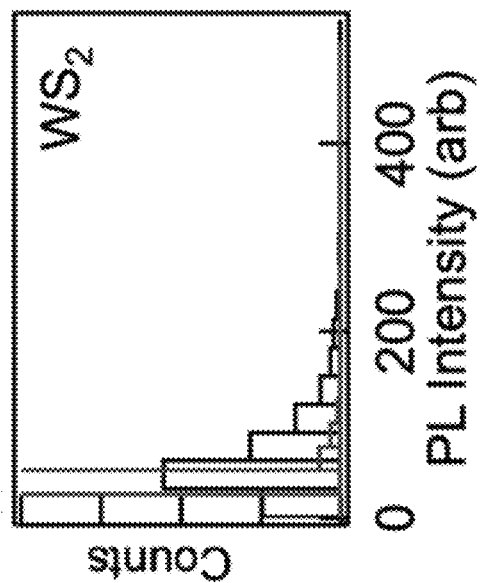
Figure 5E:
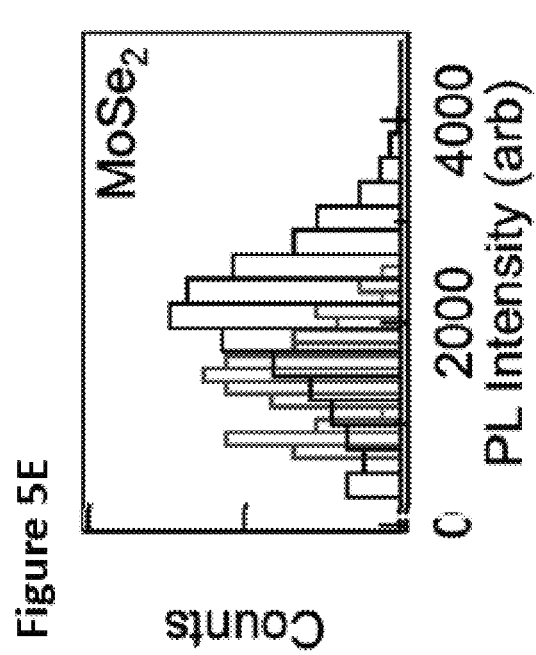

The quality of the large single crystal monolayer is comparable to or slightly better than that of microscopic single crystal monolayers produced from the Scotch tape method, as evidenced in the clean surface characterized by atomic force microscopy (AFM) and the crystal quality characterized by photoluminescence (PL) spectroscopy. AFM image of the TMDC monolayer flakes reveals atomic scale flatness, as shown in FIG. 4 for a $MoS_2$ monolayer. PL spectroscopy can be particularly sensitive to defects and disorder, as increased peak width is evidence of inhomogeneous broadening (disorder) and reduced intensity indicative of defect-mediated nonradiative recombination.

Low temperature PL spectra of the macroscopic TMDC monolayers from the metal tape method disclosed herein and microscopic monolayers from the Scotch tape method can be compared with all monolayers encapsulated in h-BN to eliminate the effect from substrate defects and inhomogeneity as shown in FIGS. 5A-5G. For $MoS_2$ and $MoSe_2$, the PL spectra from the two methods are nearly identical. The former is characterized by the dominant A exciton and the latter shows the A exciton and the trion peaks, both nearly independent of the two exfoliation methods. PL image histogram analysis (FIG. 5A-5G) shows that the PL intensities from the macroscopic monolayers are consistent with or slightly higher than those from the standard Scotch tape method. For $WS_2$ and $WSe_2$ monolayers, the PL spectra from methods are similarly complex due to the presence of dark excitons and many-body states; however, overall PL intensity in these macroscopic monolayers is still comparable to or slightly higher than those from the Scotch tape method. These results confirm the high quality of the macroscopic TMDC monolayers.

Figure 6:
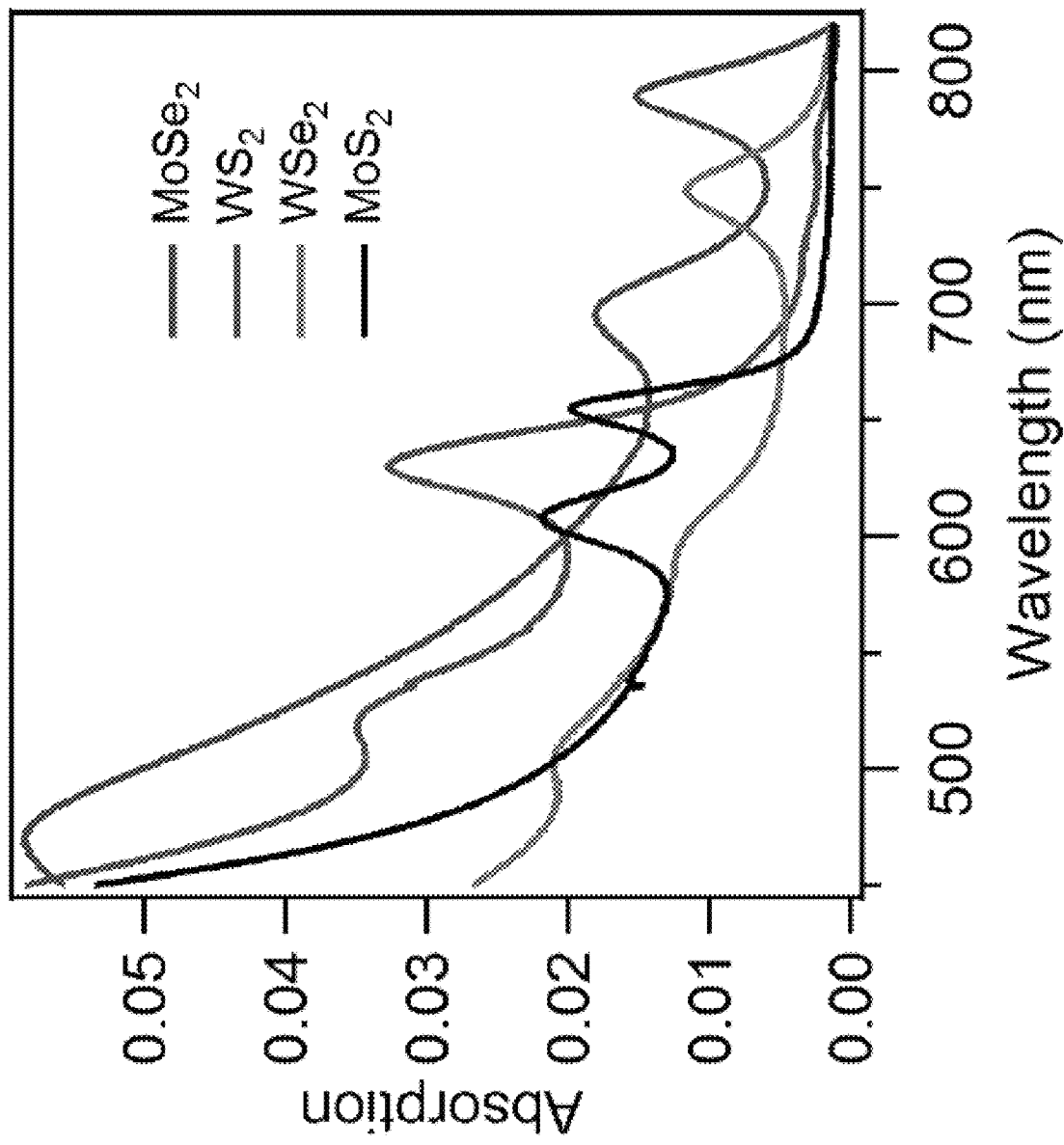
FIG. 6 illustrates UV-Vis spectra of the single crystal monolayers prepared from metal tape exfoliation on fused silica substrates in accordance with certain embodiments of the present disclosure.

Obtaining macroscopic single crystal monolayers of 2D vdW crystals with high throughput has a broad range of applications, spanning from spectroscopy, to scalable devices, and to the easy assembly of artificial lattices. For example, the macroscopic size of the TMDC monolayers prepared on transparent substrates allows use of a conventional UV-Vis spectrometer to obtain optical absorption spectra of TMDC monolayers (FIG. 6), each featuring the well-known A and B excitons. The effective disassembly of the bulk crystal into individual single crystal monolayers with defined crystal orientation allows reassembly into artificial vdW crystals with desired properties. Specifically, the flexible and flat metal tape can be used as an effective pick-up tool to reassemble higher-order vdW lattices from the macroscopic single crystals. Two examples include: (1) the reassembly of macroscopic TMDC monolayers into an artificial crystal lattice with AA stacking for greatly enhanced nonlinear optical response; and (2) the formation of a macroscopic heterobilayer from two distinct TMDC monolayers.

The first example targets effective engineering of nonlinear optical properties in an ultrathin material. TMDC monolayers, with intrinsically broken inversion symmetry, are known to possess ultra-strong nonlinear susceptibilities as reflected in intense second harmonic generation (SHG). However, TMDC bulk crystals exhibit 2H centro-symmetry; the crystal orientation of neighboring layers is 180° counter-aligned with each other in the so-called AB stacking. Due to cancellation between counter-aligned layers, the SHG response is smaller in few-layer samples, becoming asymptotically negligible for the bulk crystal. Indeed, interference in SHG from individual monolayers in stacked homo- or hetero-bilayers is very sensitive to the alignment angle between the two layers. TMDC bulk crystal can be disassembled into individual monolayers, and the even (or odd) monolayers can be reassembled into artificial crystals.

Figure 7B:
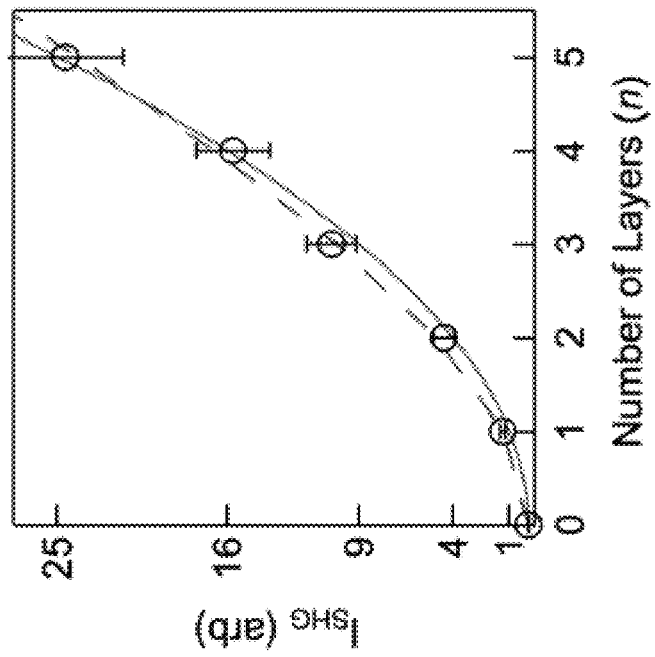
FIGS. 7A-7B illustrate second-harmonic generation intensity of macroscopic MoSe$_2$ artificial lattices in accordance with certain embodiments of the present disclosure.
Figure 7A:
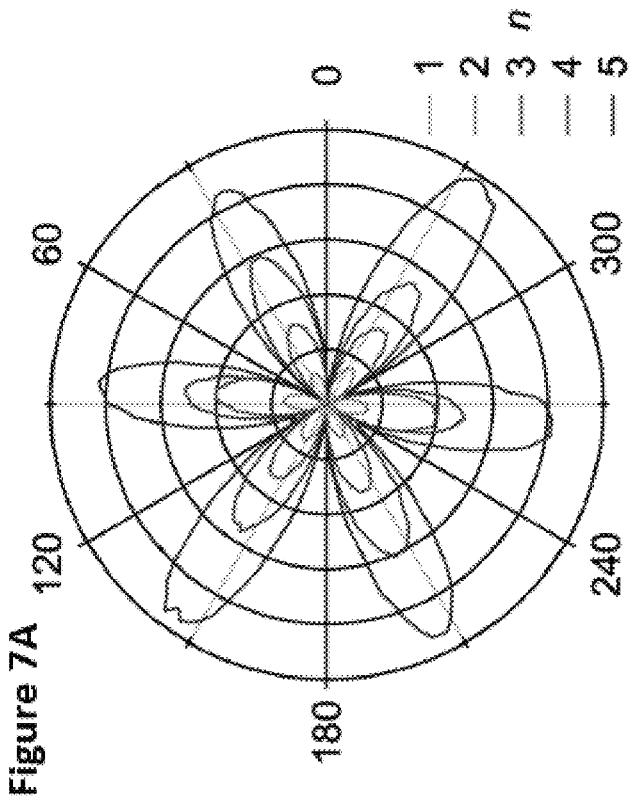
Figure 8B:
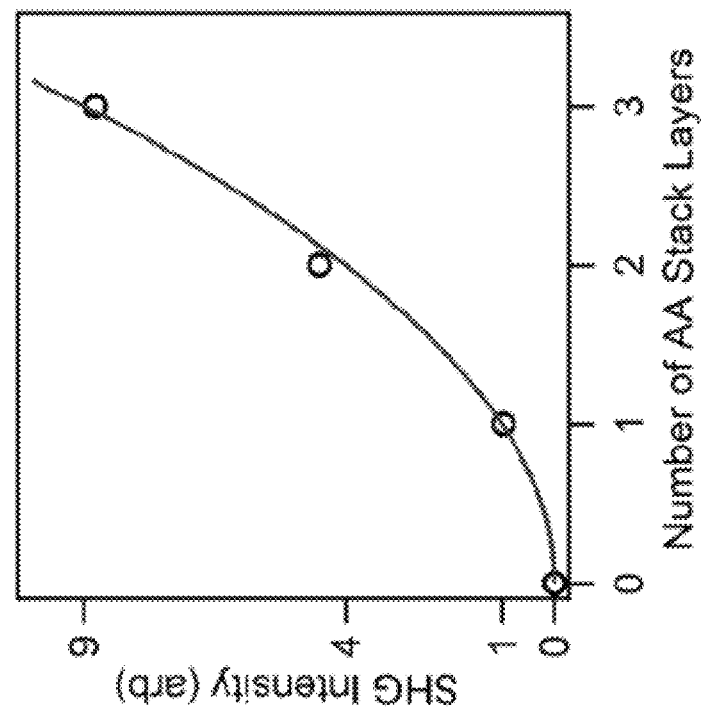
FIGS. 8A-8B illustrate second-harmonic generation intensity of macroscopic MoS$_2$ artificial lattices in accordance with certain embodiments of the present disclosure.
Figure 8A:
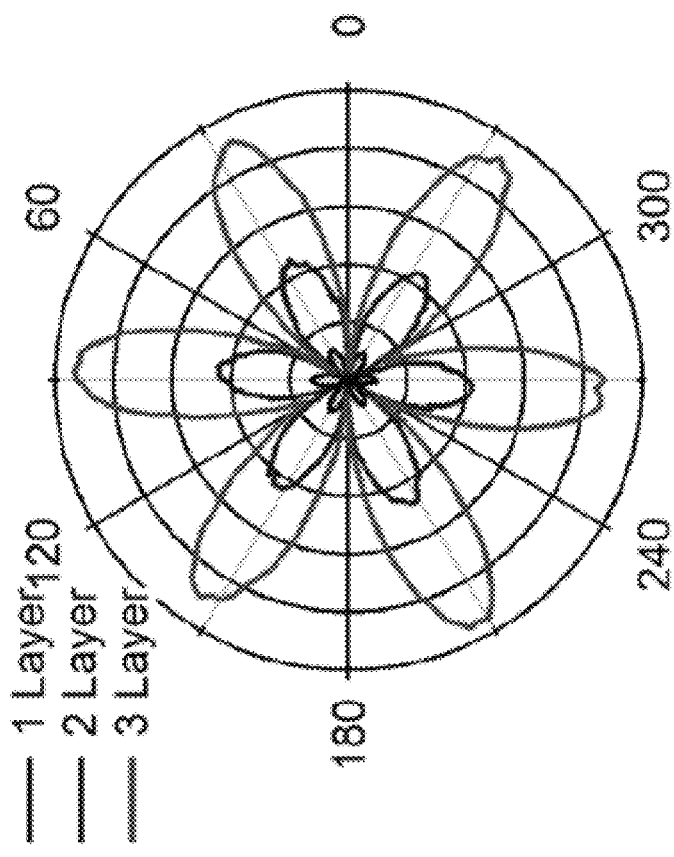
Figure 9A:
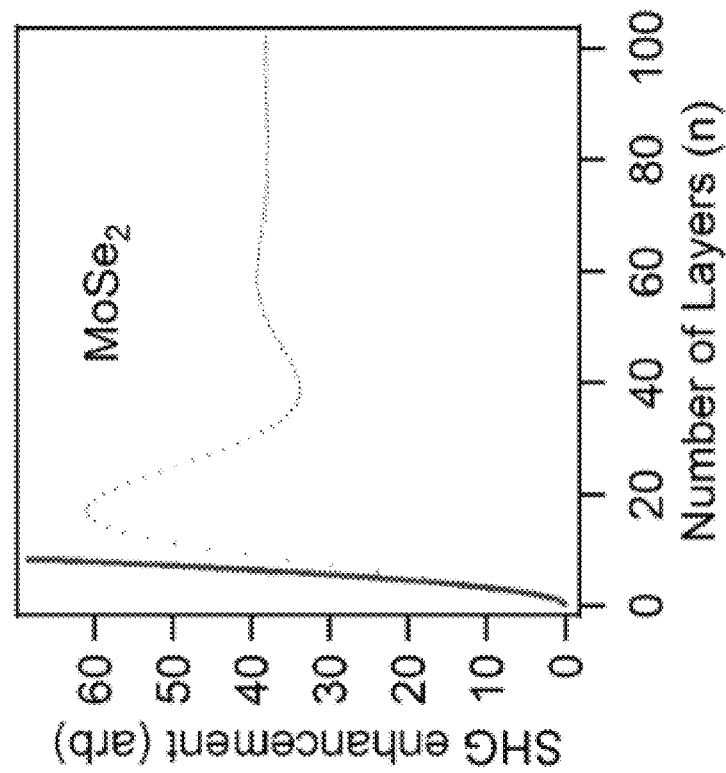
FIGS. 9A-9D illustrate simulations of second-harmonic generation intensity enhancement of macroscopic artificial lattice in accordance with certain embodiments of the present disclosure.
Figure 9B:
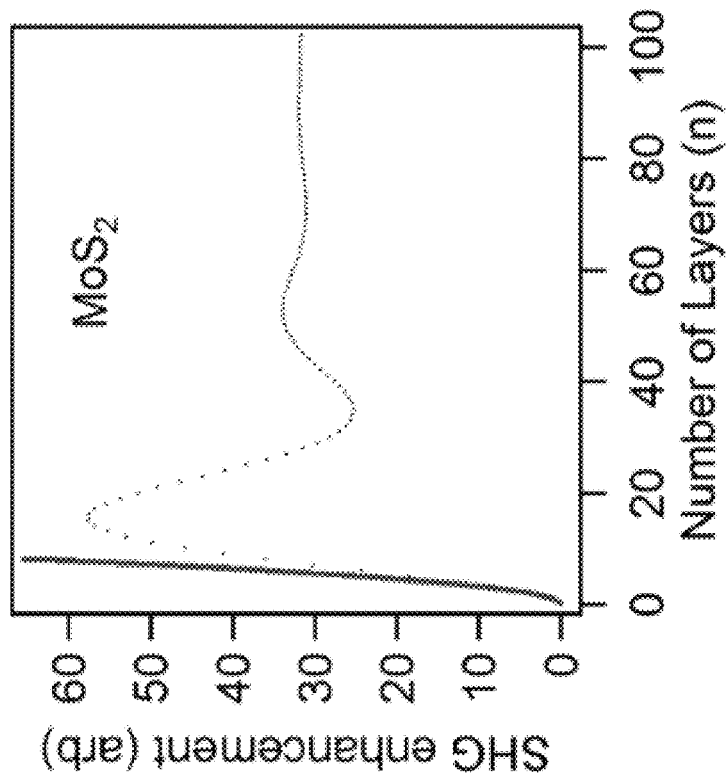
Figure 9C:
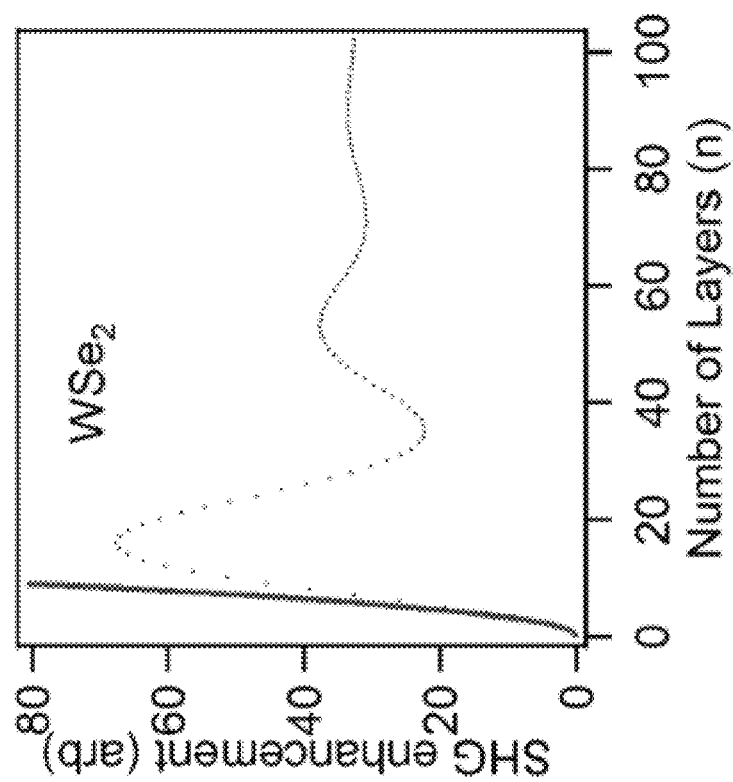
Figure 9D:
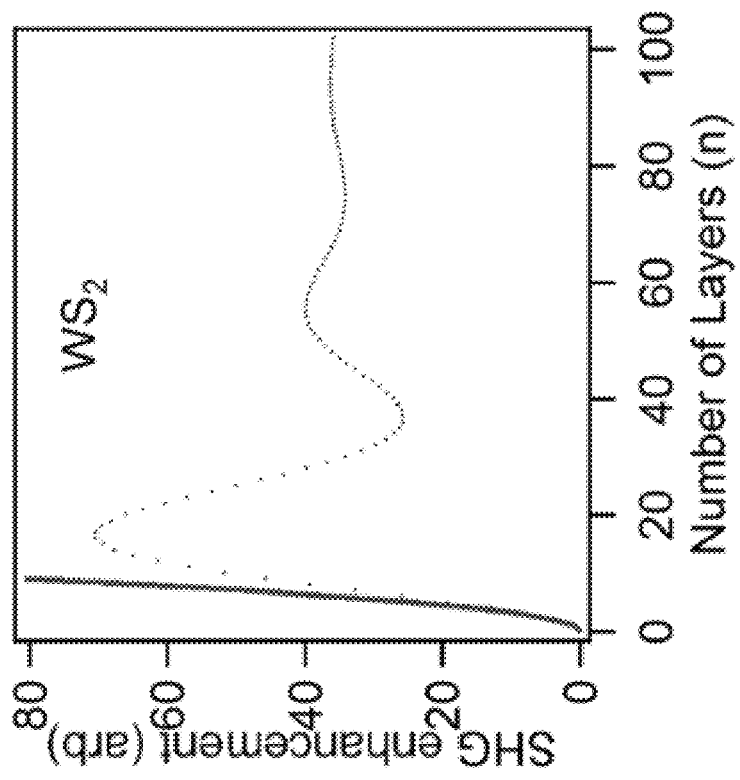

FIG. 7A shows angle-resolved SHG responses from 1-5 layers of an AA-stacked $MoSe_2$ artificial lattice, with the integrated SHG intensities ($I_{SHG}$, circles) plotted against the number (n) of the monolayers in FIG. 7B. Similar results for AA stacked $MoS_2$ are shown in FIGS. 8A-8B. The dashed line in FIG. 7B corresponds to fit which take into account reabsorption and interference of SHG from different layers. At ultrathin thickness, the SHG response is dominated by constructive interference from adjacent layers, close to the ideal limit of a quadratic optical response, $I_{SHG} \propto n^2$, the solid curve in FIG. 7B. The close to perfect coherent enhancement benefits from the negligible phase mismatch over nanometer distances. With increasing thickness of the artificial lattice, the increase of coherent response is expected to continue, until 10s nm when phase mismatch and reabsorption of SHG light become significant, as is shown in FIGS. 9A-9D. While synthesis of 3R phases of TMDC with broken inversion symmetry is possible, the techniques disclosed herein are unrestricted by synthesis and can be used to construct any macroscopic vdW multilayer structures with control in interlayer twist angles and chemical identities. As one indication of the consistency of the artificial lattices from the macroscopic monolayers, FIG. 7 illustrates the SHG response from the $MoSe_2/WSe_2$ heterobilayer at five randomly picked spots. The orientation of the artificial lattice is unchanged from spot-to-spot with an angular resolution of ±0.5°. The SHG intensity variation is within ±15%, which can be due to small changes in optical alignment as the sample is moved macroscopically under the microscope.

The second example is the creation of heterobilayers with controlled twist angle from two macroscopic single crystal monolayers. By engineering angular and/or lattice mismatch, vdW bilayers constructed from the same or different single crystal 2D monolayers have been shown to exhibit a range of quantum phenomena, but only on μm scale samples from the Scotch tape method. This example illustrate vdW bilayers constructed from the same or different single crystal 2D monolayers on the cm macroscopic scale.

Figure 12:
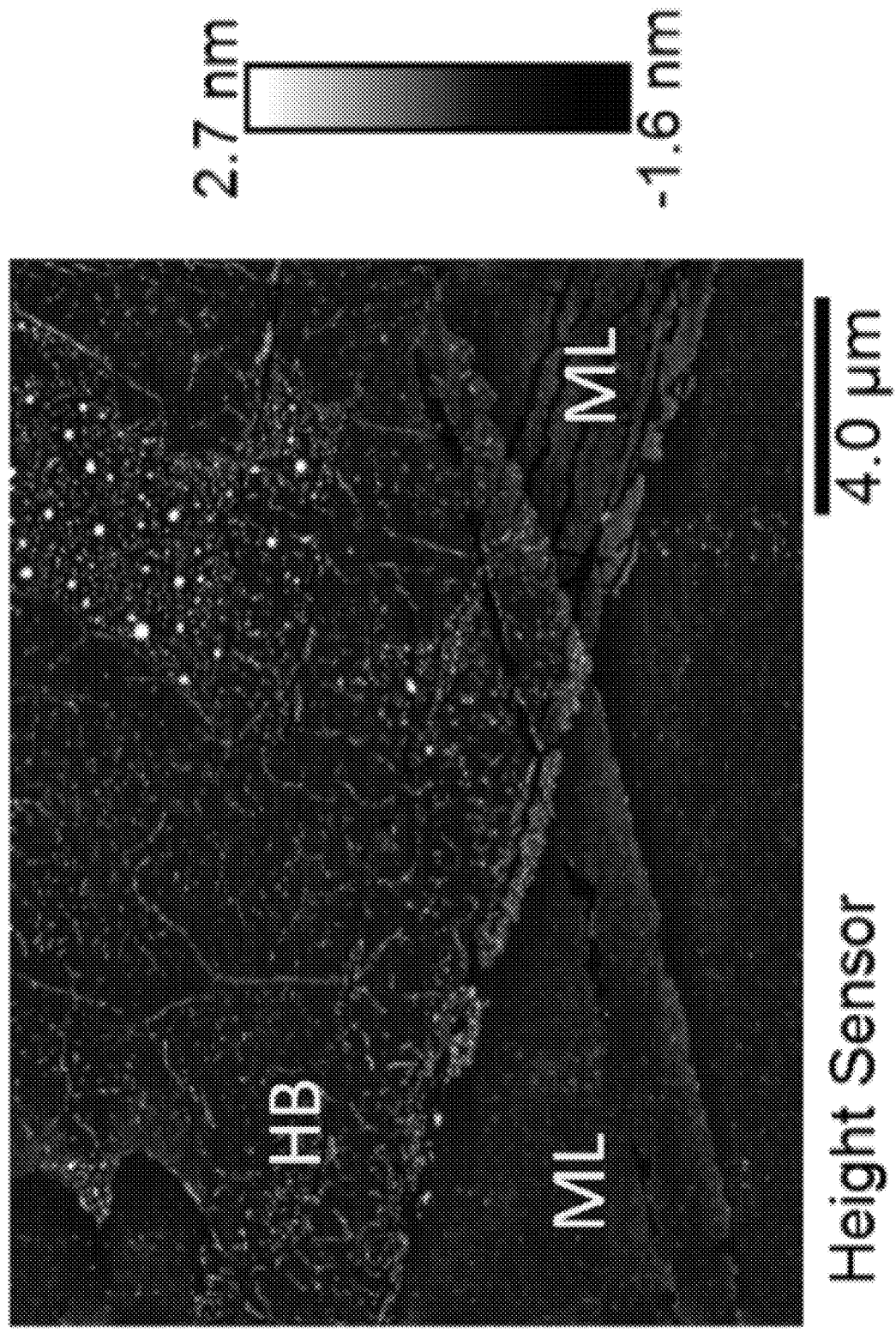
FIG. 12 is an atomic force microscopy image of a MoSe$_2$/WSe$_2$ heterobilayer prepared by the metal tape exfoliation method on a SiO$_2$/Si substrate in accordance with certain embodiments of the present disclosure.

A technological application lies in the generation of bilayer structures at macroscopic dimensions. Using two monolayers of $MoSe_2$ and $WSe_2$, a $MoSe_2/WSe_2$ single crystal heterobilayer 402 was fabricated, as is shown in optical image in FIG. 10A, with lateral dimensions of ~4 mm and with twist angle of $\Delta\Theta=3.0\pm0.5°$. AFM imaging on part of the macroscopic structure identifies the heterobilayer 402 with a high degree of flatness (FIG. 12).

Figure 10B:
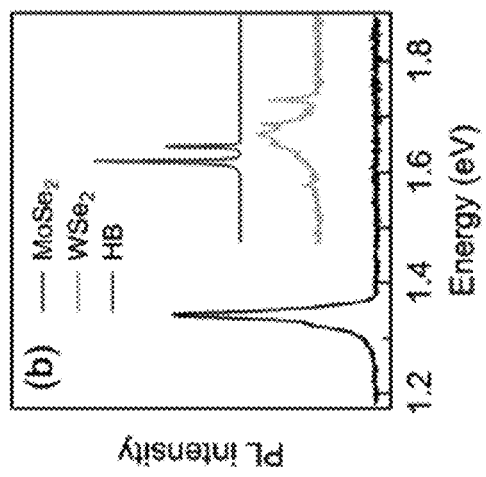
FIGS. 10A-10C illustrate a macroscopic MoSe$_2$/WSe$_2$ heterobilayer in accordance with certain embodiments of the present disclosure.
Figure 10C:
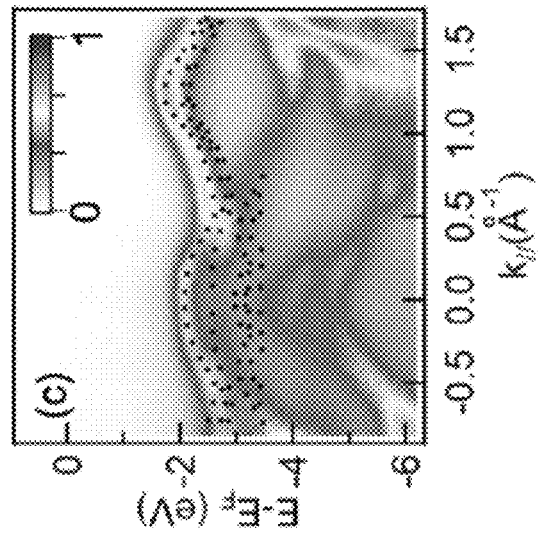
Figure 10A:
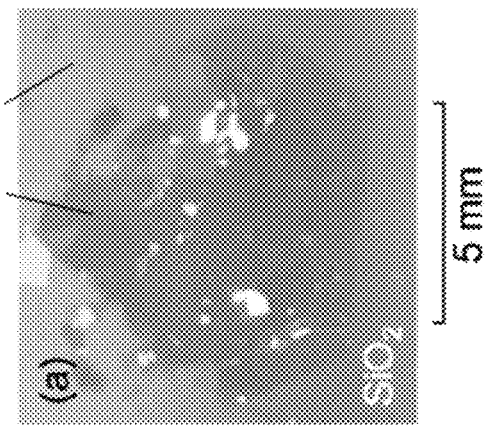
Figure 11:
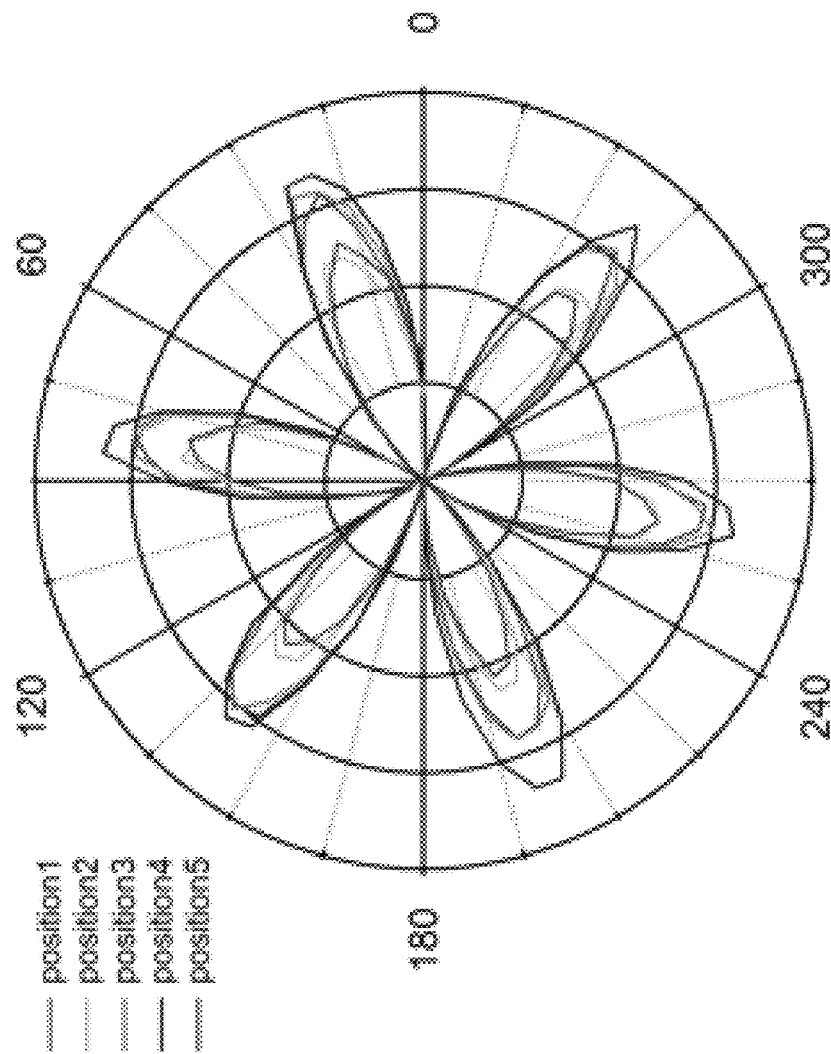
FIG. 11 illustrates second-harmonic generation intensity of the MoSe$_2$/WSe$_2$ heterobilayer as a function of the rotation angle of crystal with respect to light polarization in accordance with certain embodiments of the present disclosure.

FIG. 10B illustrates PL spectra of interlayer exciton in a heterobilayer compared to $MoSe_2$ and $WSe_2$ monolayers. The large size of the single crystal heterobilayer on a dielectric substrate ($SiO_2$) 404 allows mapping out the band structure using angle resolved photoemission spectroscopy (ARPES) using a conventional setup with hemispherical electron energy analyzer, without microscopic capabilities (μ-ARPES). The ARPES spectrum determined in the F-K direction is in excellent agreement with theoretical calculations (FIG. 10C). Low temperature PL measurement of BN encapsulated heterobilayer stack reveals the dominant radiative recombination from the charge separated interlayer exciton (FIG. 10C), in agreement with interlayer excitons in MoSe$_2$/WSe$_2$ heterobilayers with microscopic dimensions fabricated from the Scotch-tape method. Moreover, the intralayer excitons from constituent monolayers in the heterobilayer sample are completely quenched, verifying the high quality of the MoSe$_2$/WSe$_2$ interface.

Methods

The present disclosure also provides methods for preparing vdW crystals. In certain embodiments, a 150 nm thickness gold layer can be deposited onto flat silicon substrate (NOVA Electronic Materials LLC, p type doped) with e-beam evaporation (Angstrom Engineering EvoVac Multi-Process thin film deposition system). A layer of polyvinylpyrrolidone (PVP) solution (Sigma Aldrich, mw 40000, 10% wt in ethanol/acetonitrile wt 1/1) can be spin-coated on the top of the gold film and cured at 150° C. for 5 min as a sacrificial layer to prevent tape residue contamination. The prepared PVP and gold layers can be picked up with thermal release tape (semiconductor corp. release temperature 90° C.), revealing an ultra-flat, clean, and fresh gold surface, i.e., the gold tape. The gold tape can be gently pressed onto a freshly cleaved bulk vdW crystal, including a MoS$_2$ natural single crystal (SPI Supplies), WS$_2$, MoSe$_2$, WSe$_2$, and ReS$_2$ single crystals (HQ graphene), and the MoSe$_2$ and WSe$_2$ single crystals from a flux-growth method with significantly reduced defect density. As the tape is lifted off the surface, it can carry the PVP and gold layers with a monolayer 2D crystal attached to gold surface, and can further transferred onto the desired substrate.

The thermal release tape can be removed by heating at 130° C. The PVP layer can be removed by dissolving in deionized (DI) water for 2 hours. The sample on the substrate covered by gold can be rinsed with acetone and cleaned by O$_2$ plasma for 3 min to remove any remaining polymer residues. The gold layer can be dissolved in a KI/I$_2$ gold etchant solution (2.5 g I$_2$ and 10 g KI in 100 ml DI water. Iodine, 99.99%, Alfa Aesar; potassium iodide, 99.9%, Alfa Aesar). The monolayer can be rinsed with DI water and isopropanol, and dried with N$_2$. For stacking of multiple AA stacks, a collection of single crystal monolayers from the same single crystal can be prepared on SiO$_2$/Si substrates (SiO$_2$ thickness=285 nm) with known sequences of odd-even order. An ultra-flat gold tape, freshly peeled off the Si templating surface, can be used to pick up only even or odd monolayers sequentially with angular alignment, $\Delta\Theta=0.0\pm0.5°$. The SHG measurements can be performed on the stacked monolayers on gold after each pick up. For stacking of macroscopic heterobilayer, a freshly prepared gold tape can be used to pick up a MoSe$_2$ monolayer and then can be pressed onto another freshly prepared WSe$_2$ monolayer on the SiO$_2$/Si substrate with pre-determined alignment angle, followed by the same rinsing and etching procedure.

Thin BN flakes for encapsulation can be exfoliated with scotch tape onto the SiO$_2$/Si surface (SiO$_2$ thickness 285 nm). The TMDC monolayers are prepared either from the gold tape technique or traditional scotch tape exfoliation onto the SiO$_2$/Si substrate. A film of polypropylene carbonate ("PPC") can be prepared on top of a small polydimethylsiloxane (PDMS) stamp taped on a glass slide. The glass slide can be inverted and fixed on a transfer stage with objective lens, and can be used to sequentially pick up the flakes with controlled contact point. Lifting of the first BN flake can be achieved by controlled expansion of PPC through increasing and decreasing temperature near 40° C. After the first BN flake is picked up to PPC, the process can be repeated to pick up the TMD monolayer and the last layer of BN. The thin flakes can be more adhesive to BN than to SiO$_2$/Si substrate, permitting encapsulation of BN/TMD/BN stacks on PPC surface. The stack can be further transferred onto desired substrate by pushing the PPC onto the substrate and heating substrate to 90-120° C. to melt PPC, allowing the stack to stay on the substrate while the glass slide and PDMS are removed.

The SHG measurements can be performed at room temperature on an inverted microscope (Olympus IX73, with 100× objective). The pump 800 nm for SHG can be generated from an ultrafast Ti:Sapphire oscillator (SpectraPhysics Tsunami, pumped by Sprout D, 5 W, Lighthouse Photonics), and reflected off a 650 nm short-pass dichroic mirror, and is focused onto the sample with a 100× objective. The SHG of the sample can transmit through the 650 nm short-pass dichroic mirror and a 400 nm bandpass filter before it is collected with a photomultiplier tube. The signal can be amplified and detected with a photon counter. The polarization for both the input laser and the collection path can be rotated simultaneously relative to the sample, by rotating a half waveplate between the objective and the dichroic mirror, intersecting both the excitation and collection path. Therefore, the polarization response of SHG can be equal to rotating the sample, giving rise to a 6-fold symmetry.

For ARPES measurements, the TMDC heterostructure on SiO$_2$/Si substrate can be transferred to an ultrahigh vacuum chamber ($\sim 10^{-10}$ Torr) and annealed at 200° C. for 4 h via direct current heating to remove residual contaminants. A gold contact can be placed on the side for grounding. The ARPES measurements can be carried out in the ultrahigh vacuum at room temperature. For photoionization, a 22 eV extreme UV radiation can be obtained from high harmonic generation (HHG) from 400 nm input laser light in Kr gas. The 400 nm light can come from the second harmonic of the output of a regenerative Ti:Sapphire amplifier (Coherent Legend Elite Duo HE+, 10 kHz, 35 fs). HHG can be generated in a modified KMLabs XUUS4 high harmonics systems. The kinetic energy of the photoemitted electrons can be measured on a hemispherical electron energy analyzer equipped with a 2D delay line detector (SPECS Phoibos-100).

The TMDC heterobilayer and monolayer samples on SiO$_2$/Si substrates can be placed in a liquid helium recirculating optical cryostat (Montana Instruments Fusion/X-Plane) at 4 K in vacuum (<10-6 torr). The incident laser beam (532 nm, CW) can be focused on the sample by a 100×, NA 0.75 objective (Zeiss LD EC Epiplan-Neofluar 100×/0.75 HD DIC M27) to a diffraction limited spot. The excitation power can be approximately 80 uW, measured by a calibrated power meter (Ophir StarLite). PL emissions from the sample plane can be imaged with a home-built scanning confocal microscope system with a Galvo-Galvo scanner (Thorlabs, GVS012/M). The photoluminescence can be collected by the same objective, focused into a spectrograph (Princeton Instruments, IsoPlane 160) and detected by a liquid-N$_2$ cooled InGaAs photodiode array (Princeton Instruments PyLoNIR) within the desired wavelengths.

The wave propagation of 400 nm and 800 nm light in the SHG process can be calculated with the reported optical constants, taking into the account a) absorption of 400 nm and 800 nm as they propagate through the thin layer crystal and b) interference of 400 nm generated from each layer. Simulated results are displayed in FIGS. 9A-9D. The red curve shows the quadratic response for coherent interference enhancement assuming zero phase delay for SHG from all layers. At few layer numbers, the simulation is close to the quadratic response. With increasing thickness of the AA stacked lattice, phase mismatch and reabsorption of SHG light become significant, and the response deviates from quadratic coherent enhancement. The peak of the enhancement is predicted to be approximately 60-fold for $MoS_2$ AA stacked layers, which is consistent with a SHG enhancement from different thickness of 3R phase $MoS_2$, which has non-centrosymmetric with AA stack interlayer alignment.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within its spirit and scope.

The invention claimed is:

1. A method for generating one or more single crystal monolayers from two-dimensional van der Waals crystals, comprising:
   providing a bulk material comprising a plurality of van der Waals crystal layers; and
   exfoliating one or more single crystal monolayers of van der Waals crystal from the bulk material by applying a flexible and flat thermal release metal tape having a soluble protection layer and a metal layer to a surface of the bulk material;
   wherein the flexible and flat metal thermal release tape has a surface root-mean-square roughness of less than 2 nm.

2. The method of claim 1, wherein the flexible and flat metal tape has a surface root-mean-square roughness of less than 1 nm.

3. The method of claim 1, wherein the metal comprises air-stable metals, including coinage metals.

4. The method of claim 1, wherein the metal is selected from the group consisting of Gold, Silver, Platinum, Palladium, Coper, Nickel, and Chromium.

5. The method of claim 1, further comprising assembling the one or more single crystal monolayers into an artificial lattice.

6. The method of claim 1, wherein the exfoliating comprises: pressing the flexible and flat metal tape on to a surface of the bulk material; and removing the flexible and flat metal tape off the surface to form a single crystal monolayer on the metal surface.

7. The method of claim 6, wherein the removing further comprises:
   heating the tape;
   dissolving the protection layer in a solvent; and
   dissolving the metal layer in an etchant solution.

* * * * *